US005364497A

United States Patent [19]
Chau et al.

[11] Patent Number: 5,364,497
[45] Date of Patent: Nov. 15, 1994

[54] METHOD FOR FABRICATING MICROSTRUCTURES USING TEMPORARY BRIDGES

[75] Inventors: Kevin H. L. Chau, North Andover, Mass.; Michael P. Saltmarsh, Concord, N.H.; Deborah A. Church, Pepperell, Mass.

[73] Assignee: Analog Devices, Inc., Norwood, Mass.

[21] Appl. No.: 101,633

[22] Filed: Aug. 4, 1993

[51] Int. Cl.$^5$ ...................... B44C 1/22; H01L 21/306
[52] U.S. Cl. ........................ 156/645; 156/643; 156/657; 437/921
[58] Field of Search ............... 156/643, 645, 655, 656, 156/657, 659.1, 662; 73/517; 437/182, 921, 927

[56] References Cited

U.S. PATENT DOCUMENTS

| | | | |
|---|---|---|---|
| 4,624,741 | 11/1986 | Daniele | 156/645 |
| 4,893,509 | 1/1990 | MacIver et al. | 73/517 AV |
| 5,130,276 | 7/1992 | Adams et al. | 437/225 |

OTHER PUBLICATIONS

*Thermal Assembly of Polysilicon Microactuators With Narrow-Gap Elecrostatic Comb Drive*, G. K. Fedder, J. C. Chang and K. T. Howe, IEEE, 1992 pp. 63–68.
*Supercritical Carbon Dioxide Drying of Microstructures*, G. T. Mulhern, D. S. Soane and R. T. Howe, 7th Inter. Conf. on Solid State Sensors and Actuators, Jun./Jul.-Oct. 93, Yohohama, JP, pp. 296≧299.
*Chemical Surface Modification of Porous Silicon*, R. C. Anderson, R. S. Muller and C. W. Tobias, J. Electrochem. Soc., vol. 140, No. 5 May 1993, The Electrochemical Society, Inc.
*Polysilicon Resistor Trimming by Laser Link Making*, D. L. Parker and W. Huang, IEEE Transactions on Semiconductor Mfg. vol. 3 No. 2 May 1990, pp. 80–83.
*Micromachining for Packaged Sensors*, M. Esashi, 7th Inter. Conf. on Solid-State Sensors and Actuators.

Primary Examiner—William Powell
Attorney, Agent, or Firm—Wolf, Greenfield & Sacks

[57] ABSTRACT

A method and apparatus for forming bridges between surfaces of a suspended microstructure and other surfaces of the suspended microstructure or particularly placed anchors on the die in order to increase the stiffness and lateral strength of the microstructure during fabrication. Once fabrication is completed, the bridges are cut by a laser thus fully releasing the microstructure into its final suspended and resilient condition.

10 Claims, 5 Drawing Sheets

METHOD FOR FABRICATING MICROSTRUCTURES USING TEMPORARY BRIDGES

FIELD OF THE INVENTION

The invention pertains to a method for fabricating suspended micromachined microstructures. More particularly, the invention pertains to a method and structure for temporarily supporting a microstructure during fabrication so as to prevent breakage or sticking of the microstructure to the substrate or itself.

BACKGROUND OF THE INVENTION

One method of fabricating chips with suspended micromachined microstructures is generally termed bulk-micromachining. In bulk-micromachining, a block of material is subtractively etched to remove material leaving behind the desired microstructured shape suspended from an unremoved portion of the substrate. Accordingly, in bulk-micromachining, the microstructure and the supporting portion of the substrate are of the same material.

Another method of fabricating chips with suspended micromachined microstructures is generally termed surface-micromachining. Surface-micromachining involves forming the microstructure over a sacrificial layer upon a substrate and then removing the sacrificial layer. For instance, a sacrificial oxide spacer layer such as silicon dioxide is deposited over the surface of a substrate of a wafer or die. The sacrificial spacer layer is selectively etched to open up a number of holes in the spacer layer down to the substrate, in which anchors for supporting the microstructure will be formed. A thin film microstructure material, such as polysilicon, is deposited over the sacrificial layer. In the holes where the sacrificial layer had been etched down to the substrate, the microstructure material contacts the substrate to form anchors for supporting the microstructure. Enough microstructure material is deposited to completely fill the holes as well as to form a uniform layer over the sacrificial layer. The microstructure material is then patterned into the desired shape. Finally, the sacrificial layer is removed (i.e., sacrificed) by, for instance, wet etching, thus leaving behind a microstructure suspended above the substrate by the anchors. U.S. patent application Ser. No. 08/028,922 filed on Mar. 4, 1993 entitled Monolithic Chip Containing Integrated Circuitry and Suspended Microstructure and assigned to the same assignee as the present application discloses in detail one such method for manufacturing a suspended microstructure.

Suspended microstructures are commonly used as sensors, such as acceleration sensors. U.S. patent application Ser. No. 08/028,922 discloses one such suspended microstructure accelerometer. The fingers of the suspended microstructure are interleaved with adjacent stationary fingers. A voltage is applied between the suspended microstructure and the stationary fingers so as to form a capacitor.

The suspension of a microstructure typically is made very thin and/or narrow so that it is resilient and will tend to deform under acceleration or other force. The deformation under force causes the suspended microstructure to move relative to the stationary fingers thus causing a change in voltage across the capacitor formed by the microstructure and the stationary fingers. The change in voltage is sensed and the force can be determined from the sensed change in voltage. Accordingly, the microstructures are typically extremely fragile such that the fabrication of wafers embodying the suspended microstructure is difficult and usually produces a relatively low yield of acceptable dies. A relatively large number of microstructures either break during fabrication or are bent enough so as to cause the suspended portion of the microstructure to contact the substrate or another portion of itself. The microstructure tends to stick to anything it comes in contact with, thus rendering the microstructure useless.

Liquid surface tension effects are among the most significant causes of microstructure breakage or failure because such surface tension tends to draw the microstructure surfaces towards other surfaces. Liquid surface tension effects occur, for instance, during drying after a wet etching fabrication step.

In fabricating suspended surface-micromachined microstructures, the sacrificial layer is commonly removed by a wet etching process in which the wafer is exposed to a chemical etching solution which dissolves the sacrificial layer but does not affect the material from which the microstructure is formed. The wafer is then washed in a rinse liquid. As the rinse liquid is removed, the surface tension of the liquid exerts forces on the delicately suspended microstructure, tending to pull the surface of the microstructure into contact with the substrate or with other nearby surfaces of the microstructure. The combination of various forces, including adhesive forces and electrostatic forces, makes it extremely difficult to separate the microstructure and/or substrate surfaces once they have come in contact. Electrostatic forces may also contribute to the initial attraction of the microstructure surfaces to other surfaces, leading to the initial contact. Accordingly, when undesirable contact occurs, the die is typically irreparable and must be discarded.

Dry etching to remove the sacrificial layer might eliminate the surface tension problem but is typically not practical because a dry etch process would likely damage the suspended microstructure material, e.g., polysilicon, due to the low selectivity of such etching techniques. Also, dry etching would not eliminate electrostatic charges, which may also be a cause of sticking.

Several researchers have reported on this problem and proposed solutions. For instance, H. Guckel, J. J. Sniegowski, T. R. Christenson and F. Raissi, "The Application of Fine-Grained Tensiled Polysilicon to Mechanically Resonant Transducers", *Sensors and Actuators*, A21, (1990) pp. 346–351, suggest a method in which the final rinse liquid is frozen and sublimated to avoid the harmful effects of liquid surface tension on microstructures. The disclosed method describes the transfer of wet wafers into a refrigeration unit to freeze the liquid (a water/methanol mixture). The wafer is then placed in a vacuum system to sublimate the frozen fluid. The technique is not practical because it requires the direct transfer of wet wafers into refrigeration systems and vacuum systems. Further, sublimation of the frozen fluid requires very long times, on the order of hours.

More recent approaches attempt to provide a temporary support structure to the microstructure during fabrication, which support structure is eliminated during the final steps of fabrication, after all possibly harmful fabrication steps have been completed. U.S. patent application Ser. No. 07/872,037 filed on Apr. 22, 1992 and assigned to the same assignee as the present application discloses a method in which, after the microstructure layer is patterned (exposing some of the sacrificial layer), but before the underlying sacrificial layer is removed, a photoresist layer is deposited and masked to expose only selected portions of the sacrificial layer which is exposed after the microstructure patterning. The selected portions of the spacer layer are then etched down to the substrate. Since most etching processes can remove material a few microns beyond the edge of the mask, a few microns of spacer can be removed from underneath the edges of the suspended microstructure even though those parts of the sacrificial layer are not exposed, but are covered by the microstructure. Another photoresist layer is then deposited over the wafer which fills in the holes which were just etched into the spacer layer, including the portions which extend underneath the microstructure. The photoresist is then developed away except for the photoresist that has filled in under the edges of the microstructure which is not developed away since it is occluded by the microstructure from the imaging process. These photoresist "pedestals" remain and will support the microstructure after the sacrificial layer is removed.

In addition, the photoresist exposure mask used for this step may be designed to leave some photoresist bridges in the layer defined by the microstructure for bridging gaps between otherwise non-contacting portions of the microstructure. The sacrificial layer is then removed in a wet etching process which does not affect the photoresist or microstructure material, both of which remain after the etching process. The photoresist pedestals which were formed beneath the edges of the microstructure remain and vertically support the microstructure above the substrate while the photoresist bridges which remain provide lateral support tending to prevent the microstructure or at least a portion of it from laterally bending. As close to the end of the fabrication process as possible, the photoresist pedestals and bridges are removed by a long oxygen plasma stripping process which does not present any liquid surface tension problems, thus leaving the microstructure freely suspended over the substrate in its final form.

The above described method is effective in increasing yield; however, it requires two additional masking procedures, including all related steps. Further, there is still a chance of sticking and failure of the microstructure during the final dry etching release step in which the photoresist pedestals and bridges are removed. Although there is no liquid surface tension problem during dry etching, the electrostatic charge problem discussed above remains and may still cause failure due to sticking of the microstructure.

G. K. Fedder, J. C. Chang, and R. T. Howe, "Thermal Assembly of Polysilicon Microstructures With Narrow Gap Electrostatic Comb Drive", *Technical Digest*, 1992 IEEE Solid-State Sensor and Actuator Workshop, Hilton Head Island, S.C., page 63, discloses another method for forming temporary support for the microstructure. This paper discloses a method by which, after the microstructure layer is deposited and patterned, a substantially thinner layer of the same material is deposited. The thin layer is etched to leave bridges between adjacent, non-contacting surfaces of the microstructure thus providing support and strength in the lateral direction. The final step in releasing the microstructure consists of melting the bridges by injecting through them an electric current which is sufficient to blow the thin links but which will not damage the thicker microstructure.

This approach allows the microstructure to be released after wafer fabrication or even after packaging. However, since the bridges must be thinner than the microstructure, this approach requires additional deposition, masking and etching steps. Further, extra probing/bonding pads, silicon area and leads are needed for inputting the current for melting the links if the final microstructure release is to occur after packaging.

SUMMARY OF THE INVENTION

In the preferred embodiment of the present invention, a microstructure is formed over the substrate of a wafer by depositing a sacrificial layer over the substrate of the wafer, patterning the sacrificial layer to provide holes down to the substrate for the formation of anchors for the suspended microstructure, depositing and patterning a microstructure layer over the sacrificial layer and then removing the sacrificial layer. The mask for patterning the microstructure layer is shaped so as to form the desired microstructure shape plus appropriately placed bridges between otherwise non-contacting surfaces of the microstructure and/or between portions of the microstructure and additional bridge support anchors for supporting and strengthening the microstructure. The bridges are preferably formed between certain surfaces of the microstructure and other surfaces of the microstructure and/or the additional bridge support anchors in areas where the microstructure surface would otherwise be particularly resilient and/or likely to come in contact with another surface. The mask for patterning anchor holes in the sacrificial layer can be adapted to include anchor holes for the formation of the bridge support anchors in addition to those anchors needed for suspending the microstructure.

The bridges remain intact until all fabrication steps are completed, at which point they are cut by a precision laser beam, thus releasing the microstructure into its final form. In fact, the microstructure can even be released subsequent to packaging if the die is packaged in a package with a laser-transparent cover.

The present invention also can be incorporated into the fabrication process of a bulk-micromachined microstructure.

BRIEF DESCRIPTION OF THE DRAWINGS

The invention will be better understood when the detailed description below is read in conjunction with the drawing in which.

DETAILED DESCRIPTION OF THE INVENTION

Figure 1:
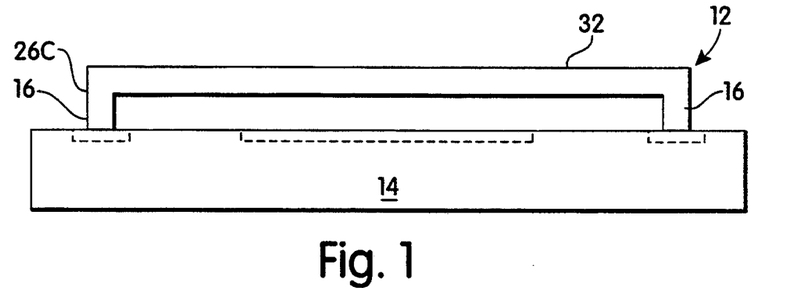
FIG. 1 is a side view of an exemplary suspended microstructure.
Figure 2:
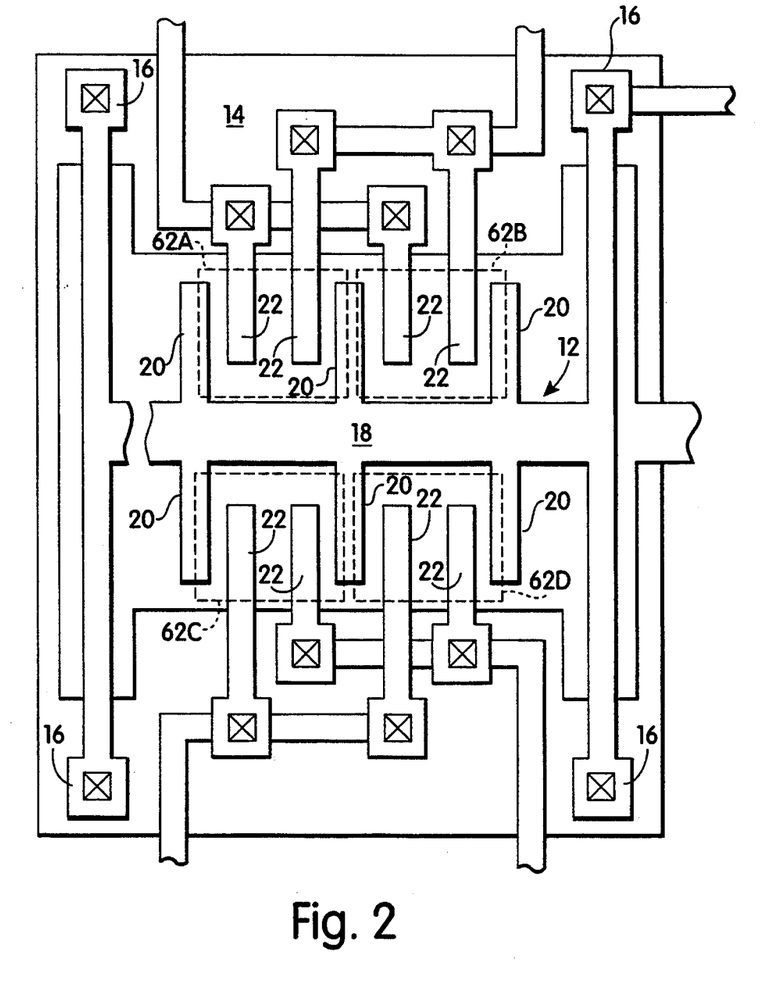
FIG. 2 is a plan view of the exemplary microstructure of FIG. 1.

FIGS. 1 and 2 are, respectively, side and plan views of an exemplary accelerometer including a suspended microstructure which can be fabricated in accordance with the present invention. The microstructure comprises a beam 12 suspended above a substrate 14 by four corner suspension anchors 16. The beam 12 comprises a central beam portion 18 having a plurality of fingers 20 extending transversely therefrom. A stationary finger 22 is positioned parallel and adjacent to each finger 20 of the beam 12. Additional bridge support anchors 25 are also provided (not shown) which are used for temporary support of the beam 12 during fabrication but serve no function during normal operation. The stationary fingers 22 and the beam 12 are electrically conductive. The stationary fingers 22 are charged to a different voltage than the beam so that a capacitive voltage exists between each stationary finger 22 and its corresponding beam finger 20. When the chip is subjected to a force, beam 12 moves relative to the stationary fingers 22, thus altering the capacitance between each stationary finger 22 and its corresponding beam finger 20. Circuitry measures the change in capacitance, which is directly indicative of the acceleration to which the bridge is subjected.

FIGS. 3–8 are plan and cross-sectional side views showing an exemplary microstructure during various phases of a surface-micromachining fabrication process. The stationary fingers are not shown so as not to obfuscate the invention. The elements are not necessarily shown to scale. It should be understood that, although the invention is described herein with respect to a surface-micromachining fabrication process, it can equally be incorporated into a bulk-micromachining fabrication process.

It should also be understood that the chip on which the microstructure is embodied may include other circuitry which may require even further additional steps in the manufacturing process which are not discussed herein. Such steps may affect the suspended microstructure and/or may require even further additional steps to be taken in order to protect the microstructure. Typically, the fabrication process of an integrated circuit chip may comprise over 300 steps. Only the handful of steps which are relevant to the present invention are discussed herein.

Figure 3:
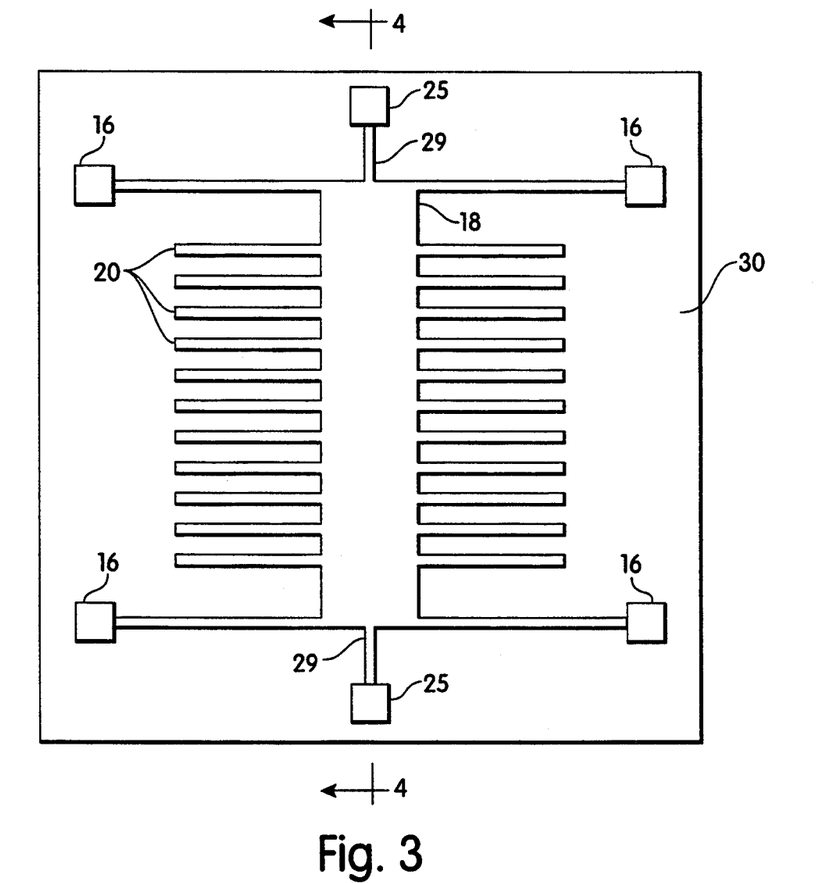
FIG. 3 is a plan view of an exemplary die during a first phase of the fabrication process of the present invention.
Figure 4:
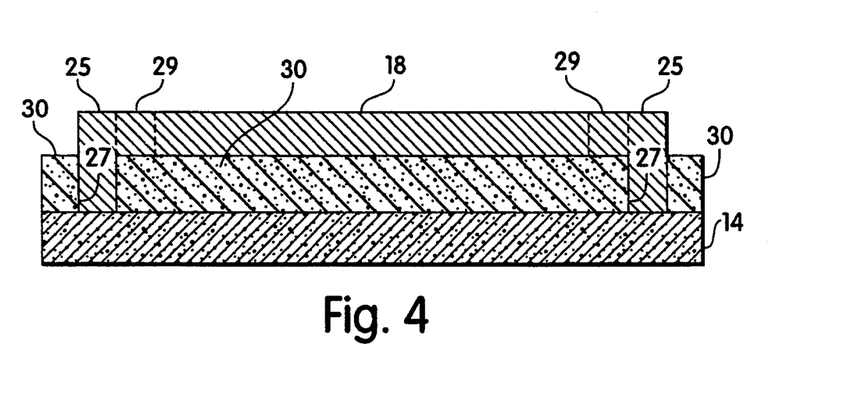
FIG. 4 is a cross-sectional side view taken along line 4—4 in FIG. 3.
Figure 6:
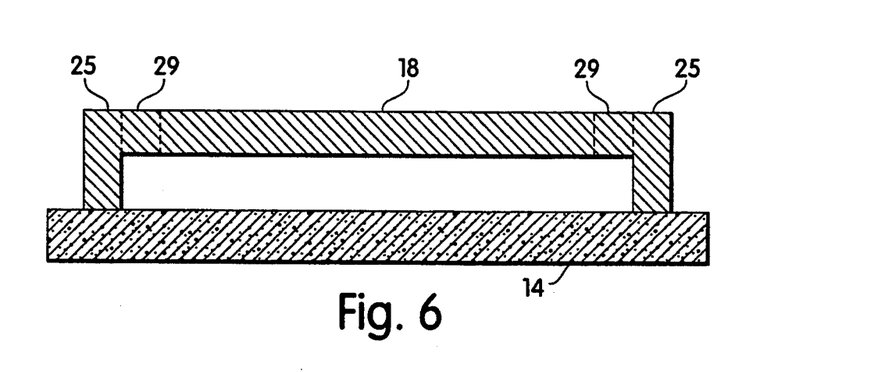
FIG. 6 is a cross-sectional side view taken along line 6—6 in FIG. 5.
Figure 8:
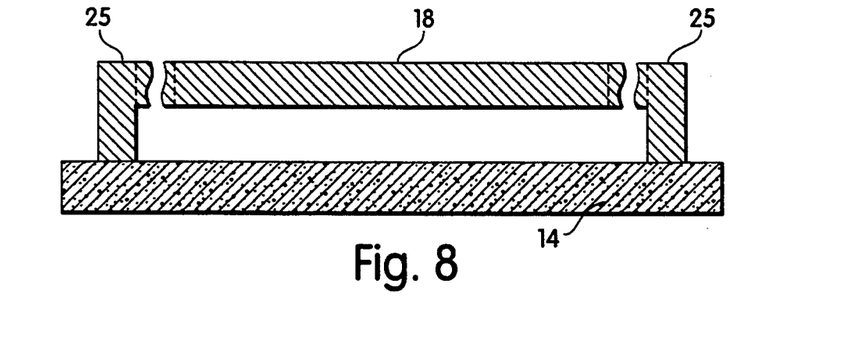
FIG. 8 is a cross-sectional side view taken along line 8—8 in FIG. 7.

FIG. 3 is a plan view of the microstructure portion of a chip shown at an initial stage of the fabrication process. FIG. 4 is a cross-sectional side view of the microstructure portion taken along line 4—4 in FIG. 3. The dotted lines in FIGS. 4, 6 and 8 are added to illustrate the various portions of the microstructure as referred to in the specification. However, it should be understood that, in actuality, the microstructure is unitary. To reach the stage shown in FIGS. 3 and 4, the substrate 14, which may be made of silicon, is covered with a layer of sacrificial spacer material 30 which, for example, may be a low-temperature oxide (LTO) such as silicon dioxide. Typically, an LTO layer is formed on a substrate by a conventional gas deposition process such as low-pressure chemical vapor deposition. However, other methods are known and may be used.

Next, a photoresist mask (not shown) is formed defining the suspension anchors 16 by which the polysilicon microstructure will be suspended. Preferably, the mask will define additional anchors to those used for suspending the microstructure during normal operation, the anchors to be used as part of the support structure of the present invention for reducing bending and sticking of the microstructure. These additional anchors are referred to herein as bridge support anchors 25. In particular, at least some of the bridges 29 of the present invention will be formed between the microstructure and these bridge support anchors 25 for providing the temporary lateral and/or vertical support for the microstructure. The spacer 30 is then etched to form anchor holes 27 which extend all the way through the LTO spacer layer to the substrate and the photoresist mask is then removed.

The material from which the suspended microstructure is to be fabricated, e.g., polysilicon, is then deposited over the substrate 14 and LTO layer 30 filling in the anchor holes 27 as well as forming a uniform layer above the LTO layer. A photoresist mask (not shown in FIGS. 3 and 4) is then formed over the polysilicon layer, the mask being shaped to form the desired microstructure shape including bridges 29 between surfaces of the microstructure and bridge support anchors 25. Although none are shown, for certain microstructures, bridges also may be formed between two otherwise non-contacting portions of the microstructure. The polysilicon is then ready to be etched or otherwise patterned after which the photoresist mask is removed.

The polysilicon may be deposited and patterned by any conventional method. For instance, polysilicon may be deposited by low-pressure chemical vapor deposition and patterned by a photoresist etching method in which the wafer is coated with a photosensitive polymer, preferably a photoresist, and then patterned by photolithography. The wafer is then exposed to a dry plasma environment (e.g., chlorine and bromine). The plasma vaporizes the portions of the polysilicon which are exposed, while the portions which are protected by the photoresist remain. The photoresist is then removed. FIGS. 3 and 4 show the wafer at this point in the fabrication process.

Figure 5:
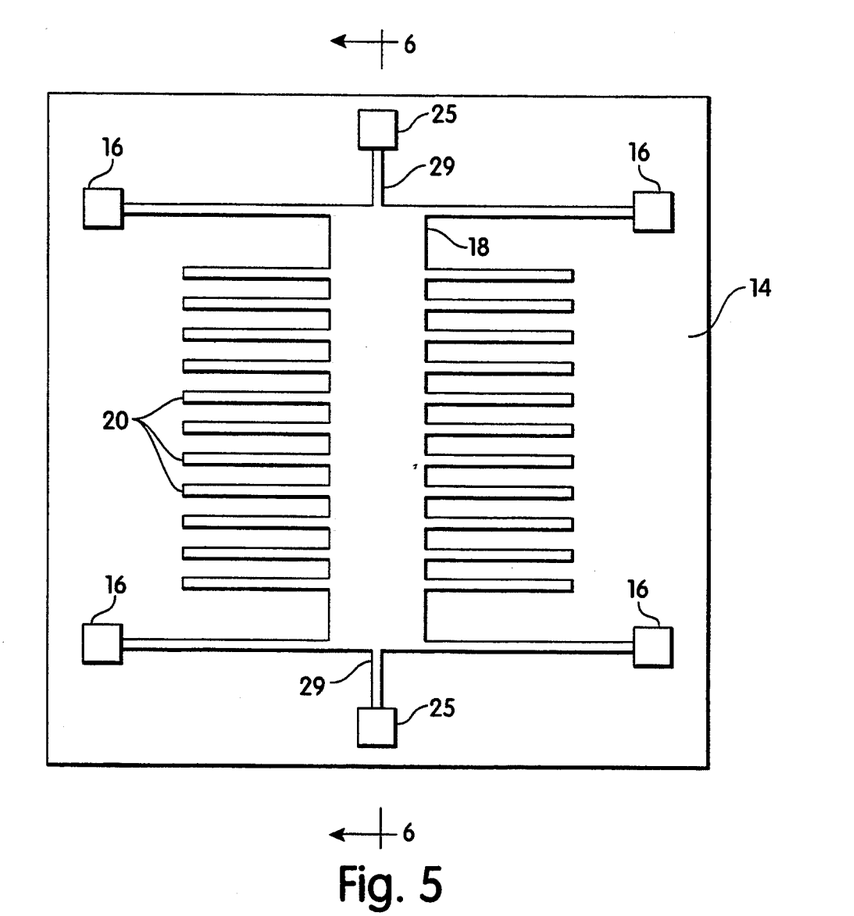
FIG. 5 is a plan view of an exemplary die during a second phase of the fabrication process of the present invention.

Referring now to FIGS. 5 and 6, the sacrificial spacer oxide 30 is then removed in a buffered oxide etch bath. The bath does not attack the polysilicon. Without the bridges 29, portions of the resilient microstructure would be extremely prone to bending and contacting the substrate and/or other portions of the microstructure during the drying procedure after the buffered oxide etch. The bridges 29 add lateral and vertical strength to the microstructure significantly reducing its resilience and thus the possibility of portions of the microstructure contacting the substrate or other portions of the microstructure.

After the wet etch step to remove the spacer layer and the subsequent drying step, the microstructure is now suspended over the substrate from its suspension anchors 16. FIGS. 5 and 6 are, respectively, plan and cross-sectional side views of an exemplary microstructures at this point in the fabrication process, i.e., with the bridges 29 still intact.

If any additional fabrication steps remain at this point which may exert stresses on the microstructure they should be performed prior to removing the bridges. The bridges may be removed and the microstructure released into its final form at any point after the last fabrication step which will exert stresses on the microstructure. Preferably, the bridges are not removed (and the microstructure released) until all fabrication steps are completed.

Bridges can also be incorporated in a bulk-micromachining process. For instance, in one particular method of fabricating bulk-micromachined microstructures, the resilient suspension portions from which the microstructure will be suspended are doped with an etch stop impurity. Particularly, a masking step is performed to expose the suspension portions of the microstructure (impurity dopant mask) and those portions are doped with a particular impurity. The microstructure typically is then etched from the back side of the wafer with a mask defining the shape of the microstructure using an impurity sensitive etchant which will not etch into the areas of the bulk material which have been doped with the impurity.

The bridges of the present invention can be incorporated in such a process by modifying the initial impurity dopant mask to include bridges. The present invention can also be incorporated in other bulk-micromachining type processes.

Figure 7:
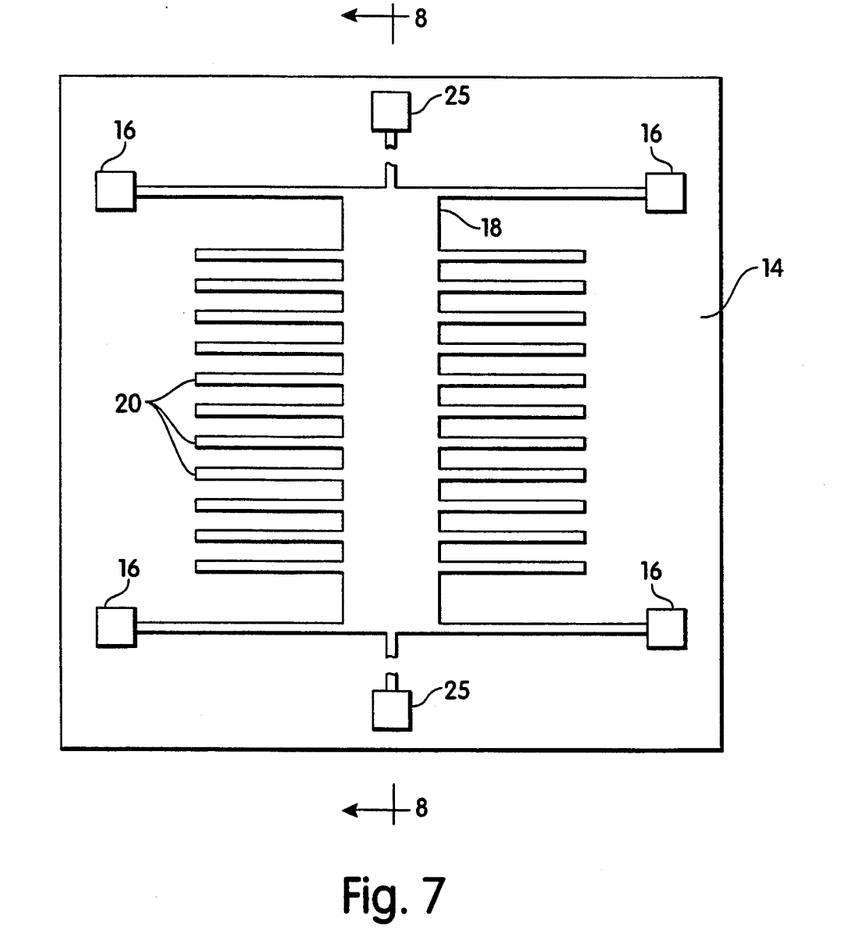
FIG. 7 is a plan view of an exemplary die after the final phase of the fabrication process of the present invention.

With either bulk-machining or surface-machining, the microstructure is finally released by cutting the bridges with a laser. In particular, a laser system with precision positioning accuracy and fine spot size is used to cut the bridges. The power of the laser is adjusted to achieve a clean cut without particle sputtering. FIGS. 7 and 8 show the microstructure after the bridges are cut.

It is important to precisely control several characteristics of the laser in order to cut the bridges without damaging the underlying substrate or the microstructure. The relevant properties of the laser include 1) power, 2) duration of blast, 3) type of blast (e.g., pulsed or steady), 4) precision positioning and focusing of the laser beam, and 5) wavelength. In particular, the power must be controlled to provide enough power to cut the bridge but not to cause explosion or sputtering of the bridge material which is being cut. Further, the duration of the beam should be controlled to be of just enough duration to cut the link. Additionally, the beam should be focused on the bridge rather than the substrate. The polysilicon layer embodying the bridge typically will be a few microns above the substrate such that a beam focused on the bridge will be substantially out of focus at the substrate. Also, the laser beam obviously must be positioned so as to strike the bridge as opposed to any surrounding structure or substrate. Even further, with respect to the surface-micromaching, the wavelength of the laser should be a wavelength which is readily absorbed by the bridge material, e.g., polysilicon, but is outside the wavelength range which the substrate material, e.g., silicon, will readily absorb. In bulk-micromachined microstructures, the substrate and the microstructure are of the same material and, therefore, wavelength differentiation is impossible. However, in a bulk-micromachined microstructure, there may be no substrate beneath the bridges in any event.

It is expected that commercially available laser systems for trimming thin film resistors in integrated circuit chips would be adequately accurate with respect to all of the above discussed properties to cut the bridges of the present invention without causing particle sputtering or any detectible harm to the underlying substrate.

It is also important to assure that any dielectric passivation layer on the substrate is of a thickness relative to the wavelength of the laser so as not to cause total internal reflection in the passivation layer. Total internal reflection of the laser beam in the passivation layer would cause undesirable localized heating, possibly damaging the passivation layer and/or the substrate.

Since the placement of the bridges and/or additional anchors is strongly dependent upon the particular shape of the microstructure, few general rules for placement of the anchors and bridges can be set forth. However, certain properties of the microstructure and/or the material from which it is constructed play a significant role in determining the most effective placement of anchors and/or bridges. In particular, the bridges and bridge support anchors should be placed to compensate for residual stresses in the microstructure material. If the anchors are not properly spaced, the microstructure may become asymmetrical when the bridges are cut. Further, in many instances, it will be impossible to avoid internal stresses on the microstructure. Accordingly, the links should be cut in a sequence which minimizes violent microstructure movements due to the relieving of stresses as the bridges are cut. Accordingly, important factors to consider in placing and cutting the bridges include 1) the location, direction and force of internal stresses in the microstructure, 2) the location of the bridges and bridge support anchors, 3) the sequence of cutting the bridges, and 4) the power and/or speed with which the bridges are cut.

At least one laser system which is adequate for use in cutting the bridges in the present invention is the model 3574 laser with LA700-00 laser source and LA711-00 optics system manufactured by ESI Corporation of Portland, Oreg. This particular laser is commonly used for laser trimming purposes during the fabrication of integrated circuit chips. It employs an Nd:YAG laser system with acousto-optic switch operating at a wavelength of 1064 nanometers.

Figure 9:
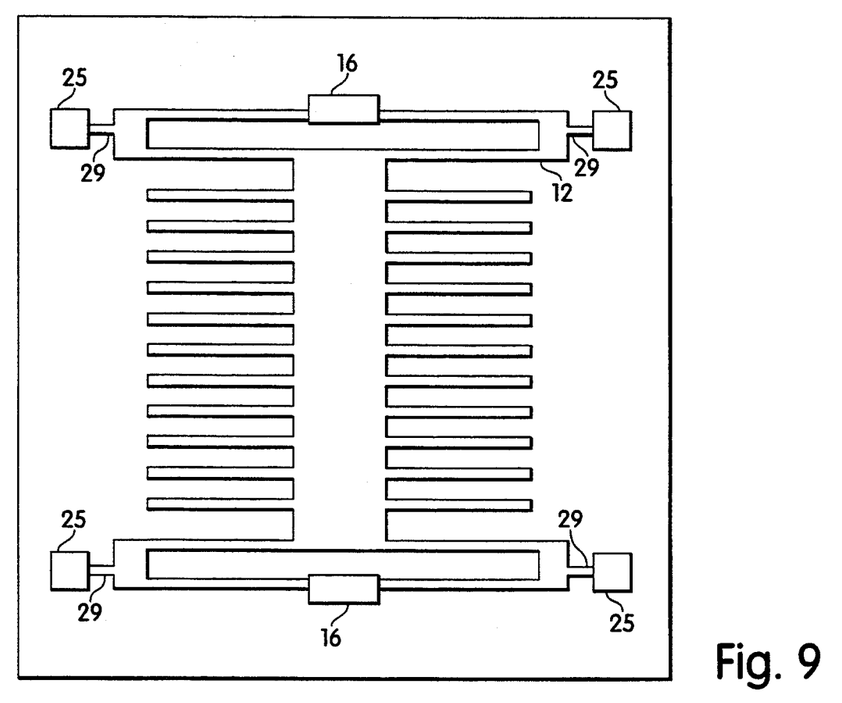
FIG. 9 is a plan view of an exemplary high g microstructure of the present invention.
Figure 10:
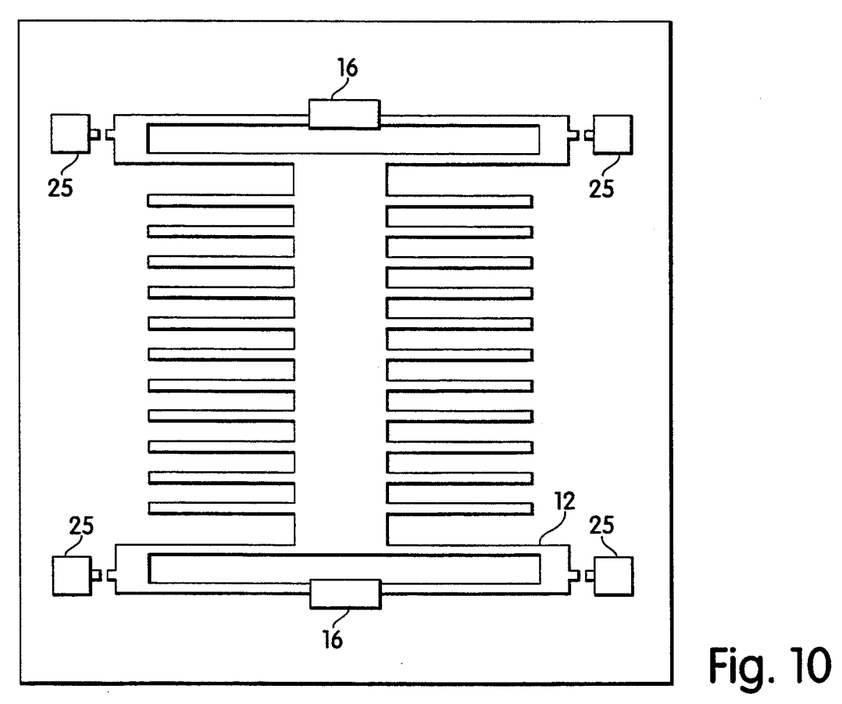
FIG. 10 is a plan view of an exemplary low g microstructure of the present invention using the same mask set as the microstructure of FIG. 9.

An advantage of the present invention relates to the fact that the same design, mask set and wafers can be used for manufacturing microstructures of various resiliences. For instance, three different accelerometers, e.g., a low g, a medium g and a high g accelerometer, can be manufactured using the same design, mask set, and wafers. FIGS. 9 and 10 illustrate this concept, with FIG. 9 showing a high g accelerometer fabricated using a particular mask set and FIG. 10 showing a more resilient low g accelerometer fabricated with the same mask set. A stiff, high g accelerometer can be produced by not cutting any of the bridges and leaving the accelerometer relatively stiff as illustrated in FIG. 9. A medium g accelerometer can be produced by cutting some of the bridges (not shown). The most resilient, low g accelerometer can be produced by cutting all of the bridges as illustrated in FIG. 10.

With the present invention, the bridges can be cut even after packaging by using an integrated circuit package with a laser transparent cover (similar in concept to a UV-transparent EPROM package). Laser cutting the bridges after packaging is especially useful for manufacturing highly fragile microstructures that would otherwise suffer a high yield loss during wafer sawing and handling.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method for fabricating a suspended, resilient microstructure of a first shape on a die, comprising the steps of:

forming said microstructure in a second shape, said second shape comprising said first shape and at least one bridge for supporting said microstructure in a less than fully resilient condition during fabrication of said microstructure; and cutting said at least one bridge.

2. A method as set forth in claim 1 wherein said cutting step is performed after all wet etching and all drying steps involved in the fabrication of said die.

3. A method as set forth in claim 2 wherein said cutting step is performed after said die is packaged.

4. A method as set forth in claim 1 wherein said forming step comprises forming said bridge between said first shape portion of said microstructure and another portion of said die.

5. A method as set forth in claim 4 wherein said forming step further comprises forming at least one bridge support anchor coupled to a surface of said die and wherein said bridge is positioned between said first shape portion of said microstructure and said bridge support anchor.

6. A method as set forth in claim 1 wherein said cutting step comprises laser cutting.

7. A method for fabricating a suspended, resilient microstructure of a first shape over a surface of a die, comprising the steps of:
   (1) depositing a sacrificial layer of material on a substrate of said die;
   (2) selectively removing portions of said sacrificial layer so as to create holes in said sacrificial layer through to said substrate for formation therein of anchors for said microstructure;
   (3) depositing a microstructure layer of material over said sacrificial layer, said microstructure to be formed of said microstructure material, said microstructure material filling in said holes in said sacrificial layer and forming a layer over said sacrificial layer;
   (4) selectively removing portions of said microstructure layer to form said microstructure in a second shape, said second shape comprising said first shape and at least one bridge positioned between a portion of said microstructure comprising said first shape and another object on said die, said bridge supporting said microstructure in a less than fully resilient condition during fabrication of said die;
   (5) removing said sacrificial layer; and
   (6) cutting said bridge.

8. A method as set forth in claim 7 wherein, in step (2), holes are formed for suspension anchors from which said first shape portion is to be suspended as well as for at least one bridge support anchor and wherein, in step (3), said bridge is positioned between said first shape portion of said microstructure and said bridge support anchor.

9. A method as set forth in claim 8 wherein, in step (4), a plurality of bridges are formed and, in step (5), less than all of said bridges are cut.

10. A method as set forth in claim 8 wherein, in step (4), a plurality of bridges are formed and, in step (5), all of said bridges are cut.

* * * * *